United States Patent
Wu

(10) Patent No.: US 7,208,785 B2
(45) Date of Patent: Apr. 24, 2007

(54) SELF-ALIGNED SCHOTTKY-BARRIER CLAMPED PLANAR DMOS TRANSISTOR STRUCTURE AND ITS MANUFACTURING METHODS

(75) Inventor: Ching-Yuan Wu, Hsinchu (TW)

(73) Assignee: Silicon-Based Technology Corp., Hsinchu (TW)

( * ) Notice: Subject to any disclaimer, the term of this patent is extended or adjusted under 35 U.S.C. 154(b) by 336 days.

(21) Appl. No.: 11/014,837

(22) Filed: Dec. 20, 2004

(65) Prior Publication Data

US 2006/0131619 A1  Jun. 22, 2006

(51) Int. Cl.
*H01L 29/80* (2006.01)

(52) U.S. Cl. .................... 257/280; 257/260

(58) Field of Classification Search ............ 257/260, 257/280–284
See application file for complete search history.

(56) References Cited

U.S. PATENT DOCUMENTS 5,925,910 A * 7/1999 Menegoli .................... 257/335

* cited by examiner

*Primary Examiner*—Roy Karl Potter
(74) *Attorney, Agent, or Firm*—Lowe Hauptman & Berner, LLP

(57) ABSTRACT

The self-aligned Schottky-barrier clamped planar DMOS transistor structure comprises a self-aligned source region being surrounded by a planar gate region. The self-aligned source region comprises a moderately-doped p-base diffusion ring being formed in a lightly-doped $N^-$ epitaxial semiconductor layer, a heavily-doped $n^+$ source diffusion ring being formed within the moderately-doped p-base diffusion ring, and a Schottky-barrier contact with the moderately-doped p-base diffusion ring acted as a diffusion guard ring being formed in a middle semiconductor surface portion of the self-aligned source region. The planar gate region comprises a patterned heavily-doped polycrystalline-silicon gate layer being silicided with or without metal silicide layers. The self-aligned source region further comprises a lightly-doped $p^-$ diffusion region being formed beneath a middle portion of the moderately-doped p-base diffusion ring.

20 Claims, 8 Drawing Sheets

SELF-ALIGNED SCHOTTKY-BARRIER CLAMPED PLANAR DMOS TRANSISTOR STRUCTURE AND ITS MANUFACTURING METHODS

BACKGROUND OF THE INVENTION

1. Field of the Invention

The present invention relates generally to a planar DMOS power transistor and its manufacturing method and, more particularly, to a self-aligned Schottky-barrier clamped planar DMOS transistor structure and its manufacturing methods.

2. Description of the Prior Art

A DMOS (double-diffused metal-oxide-semiconductor) power transistor with a low turn-on resistance becomes an important semiconductor device for applications in battery protection, switching, linear regulator, amplifier and power management.

FIG. 1A shows a schematic cross-sectional view for a non-self-aligned source structure of a prior-art planar DMOS transistor, in which a p-body diffusion region 104a is formed in a lightly-doped n⁻ epitaxial silicon layer 101 formed on a heavily-doped n⁺ silicon substrate 100 through a patterned window surrounded by a patterned polycrystalline-silicon gate layer 103a on a gate oxide layer 102a by using a first masking photoresist step (not shown); a heavily-doped p⁺ diffusion region 105a is formed within the p-body diffusion region 104a through the patterned window by using a high-energy ion implantation; a heavily-doped n⁺ source diffusion ring 106a is formed in a surface portion of the p-body diffusion region 104a and on a side surface portion of the heavily-doped p⁺ diffusion region 106a through a non self-aligned implantation window formed between a patterned photoresist layer (not shown) being formed in a middle portion of the patterned window and the patterned polycrystalline-silicon gate layer 103a on the gate oxide layer 102a by using a second masking photoresist step (not shown); a non self-aligned source contact window is formed through an etching hole surrounded by a patterned oxide layer 107a through a third masking photoresist step (not shown); and a source contact metal layer 108a is formed over the patterned oxide layer 107a and on a semiconductor surface formed by the heavily-doped p⁺ diffusion region 105a surrounded by the heavily-doped n⁺ source diffusion ring 106a and a side surface portion of the heavily-doped n⁺ source diffusion ring 106a. Apparently, the non self-aligned source structure of the planar DMOS power transistor shown in FIG. 1A needs two critical masking photoresist steps (second and third masking photoresist steps). However, misalignments of the two critical masking photoresist steps may produce non uniform current flow distribution, resulting in serious device reliability issues. Therefore, it is difficult to scale down source area of the planar DMOS power transistor. Moreover, the patterned polycrystalline-silicon gate layer 103a being acted as a gate-interconnection conductive layer may have a higher gate-interconnection parasitic resistance to reduce switching speed if the interconnected transistor cells are many. A typical example for the planar DMOS power transistor can refer to U.S. Pat. No. 5,268,586 disclosed by S. Mukherjee et al..

FIG. 1B shows an equivalent device representation of the planar DMOS power transistor shown in FIG. 1A, in which a p-n junction diode (D1) is formed between source and drain electrodes through the p-body diffusion region 104a and the lightly-doped N⁻ epitaxial silicon layer 101. This p-n junction diode (D1) will be turned on in certain circuit applications and minority-carrier storage of a forwardly biased p-n junction diode may largely reduce switching speed of the planar DMOS power transistor. Therefore, a Schottky-barrier diode had been proposed to form between the sources and drain electrodes.

Several complicate methods had been proposed to simultaneously integrate a planar DMOS transistor and a Schottky-barrier diode in a transistor cell. A typical example can refer to U.S. Pat. No. 6,686,614 disclosed by J. Tihanji and are shown in FIG. 2A and FIG. 2B, in which FIG. 2A shows a schematic cross-sectional view and FIG. 2B shows an equivalent device representation. From FIG. 2A, a Schottky-barrier diode (Ds) is formed on a lightly-doped n⁻ epitaxial silicon layer 20 through a non-self-aligned trench window formed in a middle portion of a p-body diffusion region 50. It is clearly seen that there is no diffusion guard ring formed for Schottky-barrier contact metal 90 to eliminate edge leakage and soft breakdown; the p-body diffusion region 50 is floating and isn't shorted to a heavily-doped n⁺ source diffusion ring 60; the non self-aligned trench window formed may produce non-uniform current flow distribution for nearby planar DMOS transistor cells; and the Schottky-barrier diode with a low barrier height may produce a large reverse leakage current in a forward blocking state.

It is, therefore, a major objective of the present invention to offer a self-aligned Schottky-barrier clamped planar DMOS transistor structure without using critical masking photoresist step.

It is another objective of the present invention to offer a self-aligned Schottky-barrier clamped planar DMOS transistor structure with a moderately-doped p-base diffusion ring of a planar DMOS transistor cell being acted as a diffusion guard ring of a Schottky-barrier diode to eliminate edge leakage current and soft breakdown.

It is a further objective of the present invention to offer a self-aligned Schottky-barrier clamped planar DMOS transistor structure with the moderately-doped p-base diffusion ring being shorted to a heavily-doped n⁺ source diffusion ring of the planar DMOS transistor cell.

It is an important objective of the present invention to offer a self-aligned Schottky-barrier clamped planar DMOS transistor structure with the Schottky-barrier diode being pinched by a p-n junction depletion region formed between the moderately-doped p-base diffusion ring and a lightly-doped N⁻ epitaxial silicon layer to eliminate a reverse leakage current of the Schottky-barrier diode with a low barrier height in a forward blocking state.

SUMMARY OF THE INVENTION

The present invention discloses a self-aligned Schottky-barrier clamped planar DMOS transistor structure and its manufacturing methods, in which a Schottky-barrier diode is integrated with each of planar DMOS transistor cells in a self-aligned manner. The self-aligned Schottky-barrier clamped planar DMOS transistor structure of the present invention comprises a self-aligned source region and a planar gate region, wherein the self-aligned source region is surrounded by the planar gate region. The self-aligned source region comprises a moderately-doped p-base diffusion ring being formed in a lightly-doped N⁻ epitaxial semiconductor layer through a patterned window, a heavily-doped n⁺ source diffusion ring being formed within the moderately-doped p-base diffusion ring through the patterned window, a self-aligned Schottky-barrier contact window being formed on the lightly-doped N⁻ epitaxial semiconductor layer surrounded by the moderately-doped p-base diffusion ring, the moderately-doped p-base diffusion ring being surrounded by the heavily-doped n+ source diffusion ring, and the heavily-doped n+ source diffusion ring being surrounded by a sidewall dielectric spacer formed over a sidewall of a protection dielectric layer and on a side surface portion of the protection dielectric layer in the self-aligned source region, and a self-aligned metal silicide layer being formed on the self-aligned Schottky-barrier contact window. The planar gate region comprises a patterned heavily-doped polycrystalline-silicon gate layer on a gate dielectric layer or a patterned heavily-doped polycrystalline-silicon gate layer being locally silicided with metal silicide layers through gaps between patterned capping dielectric layers on the patterned heavily-doped polycrystalline-silicon gate layer. The self-aligned source region further comprises a lightly-doped p− diffusion region being formed beneath a middle portion of the moderately-doped p-base diffusion ring. The moderately-doped p-base diffusion ring is acted as a diffusion guard ring of a self-aligned Schottky-barrier contact to eliminate edge leakage current and soft breakdown of the Schottky-barrier diode. The lightly-doped p− diffusion region is used to further increase breakdown voltage of the planar DMOS transistor cells. The metal silicide layers being locally formed on the patterned heavily-doped polycrystalline-silicon gate layer and capped with refilled dielectric layers are used to reduce gate-interconnection parasitic resistance. The self-aligned Schottky-barrier clamped n-channel planar DMOS transistor structures as described can be easily extended to form self-aligned Schottky-barrier clamped p-channel planar DMOS transistor structures by changing doping types in semiconductor regions. Moreover, the self-aligned Schottky-barrier clamped planar DMOS transistor structures can be used to fabricate insulated-gate bipolar transistors (IGBT) or MOS-controlled thyristors (MCT).

BRIEF DESCRIPTION OF THE DRAWINGS

FIG. 1A and FIG. 1B show schematic diagrams of a prior-art planar DMOS transistor structure, in which FIG. 1A shows its schematic cross-sectional view and FIG. 1B shows its equivalent device representation.

FIG. 2A and FIG. 2B show schematic diagrams of a prior-art planar DMOS transistor structure integrated with a Schottky-barrier diode, in which FIG. 2A shows its schematic cross-sectional view and FIG. 2B shows its equivalent device representation.

DETAILED DESCRIPTION OF THE PREFERRED EMBODIMENTS

Referring now to FIG. 3A through FIG. 3F, there are shown process steps and their schematic cross-sectional views of fabricating a first-type self-aligned Schottky-barrier clamped planar DMOS transistor structure of the present invention.

Figure 1A:
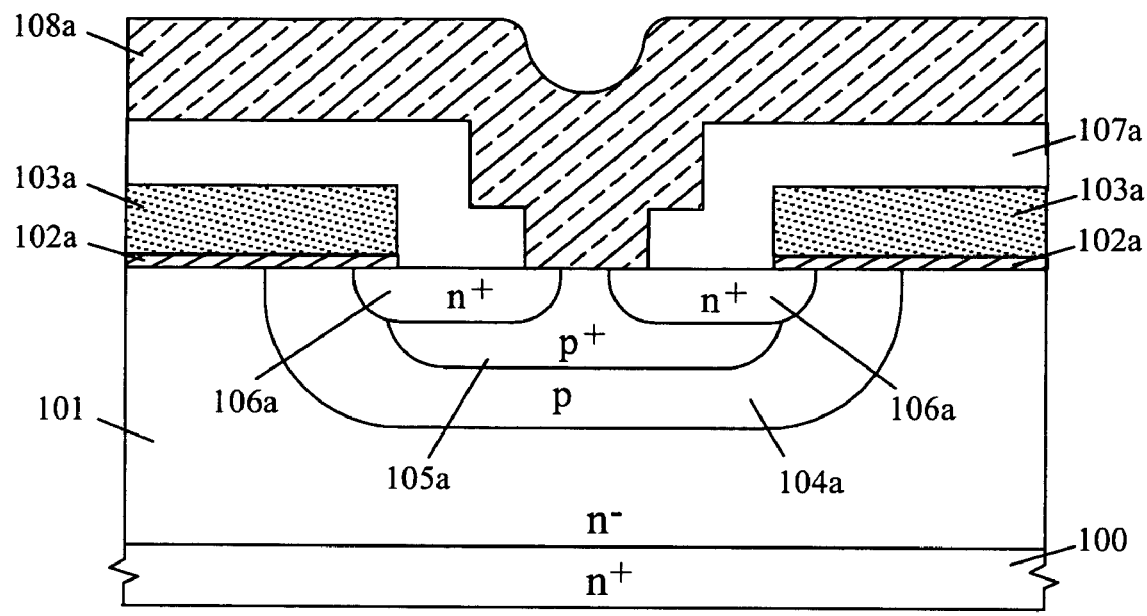
Figure 1B:
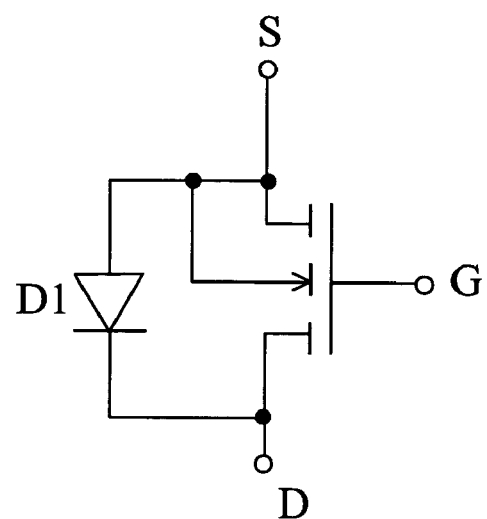
Figure 2A:
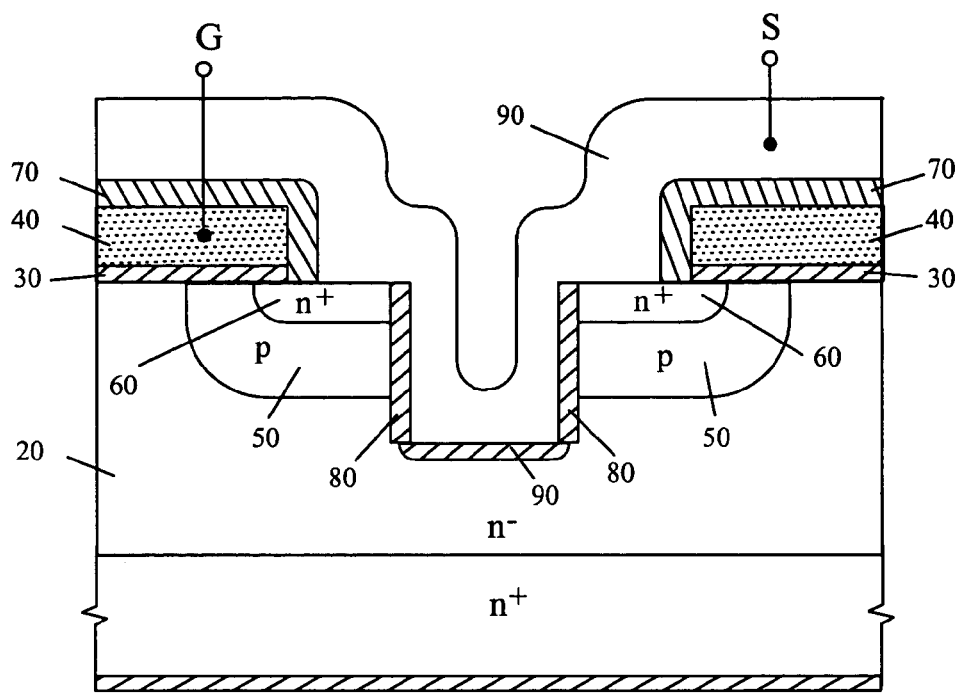
Figure 2B:
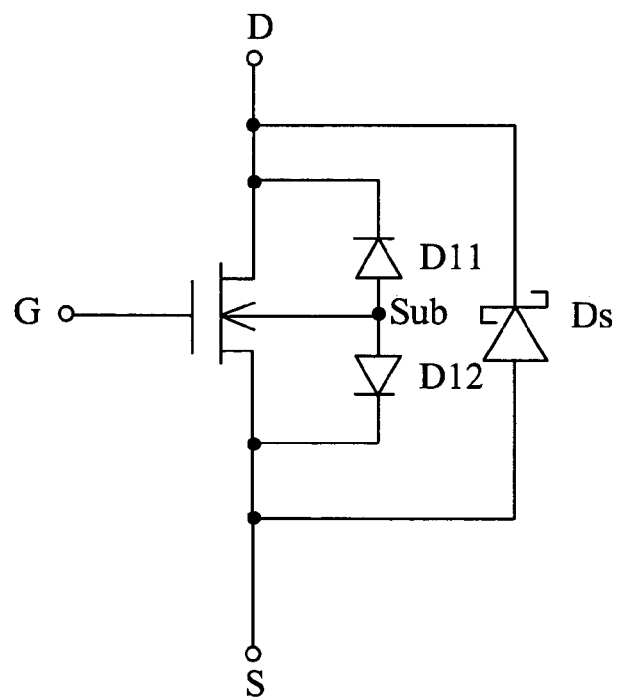
Figure 3A:
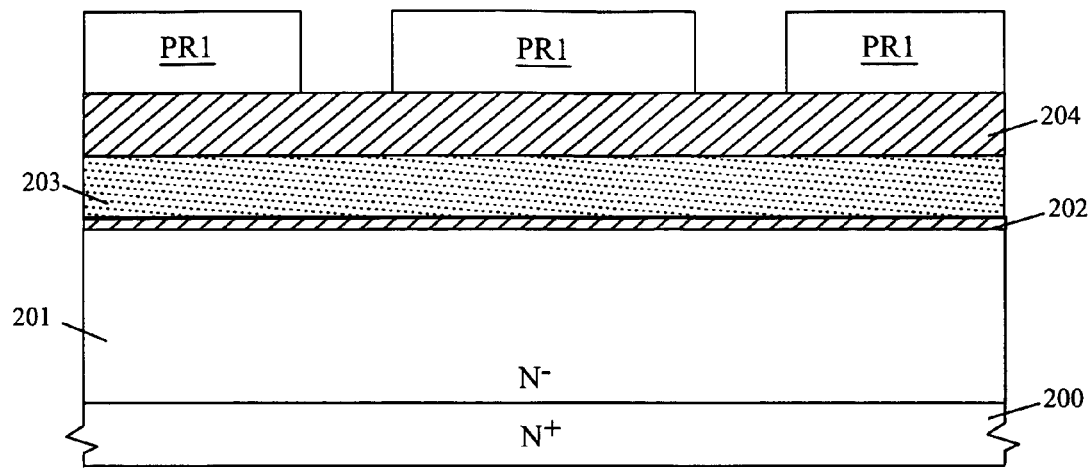
FIG. 3A through FIG. 3F show schematic process steps and their cross-sectional views of fabricating a first-type self-aligned Schottky-barrier clamped planar DMOS transistor structure of the present invention.

FIG. 3A shows a gate dielectric layer 202 is formed on an N− epitaxial silicon layer 201 being formed on an N+ silicon substrate 200; a heavily-doped polycrystalline-silicon layer 203 is then formed on the gate dielectric layer 202; a capping dielectric layer 204 is thereafter formed on the heavily-doped polycrystalline-silicon layer 203; and subsequently, a first masking photoresist (PR1) step is performed to define a plurality of implantation windows (IW). The N+ silicon substrate 200 is preferably to have a resistivity between 0.001 Ω*cm and 0.004 Ω*cm and a thickness between 300 μm and 800 μm, depending on wafer size. The N− epitaxial silicon layer 201 is preferably to have a resistivity between 100 Ω*cm and 0.1 Ω*cm and a thickness between 100 μm and 1 μm. The gate dielectric layer 202 is preferably a thermal silicon dioxide layer or a thermal silicon dioxide layer nitrided in a nitrous oxide ($N_2O$) ambient and is preferably to have a thickness between 100 Angstroms and 1000 Angstroms. The heavily-doped polycrystalline-silicon layer 203 is preferably deposited by low-pressure chemical vapor deposition (LPCVD) and its thickness is preferably between 3000 Angstroms and 7000 Angstroms. The heavily-doped polycrystalline-silicon layer 203 can be doped by in-situ, ion implantation or a conventional thermal diffusion process. The capping dielectric layer 204 is preferably made of silicon dioxide as deposited by LPCVD and its thickness is preferably between 4000 Angstroms and 10000 Angstroms.

Figure 3B:
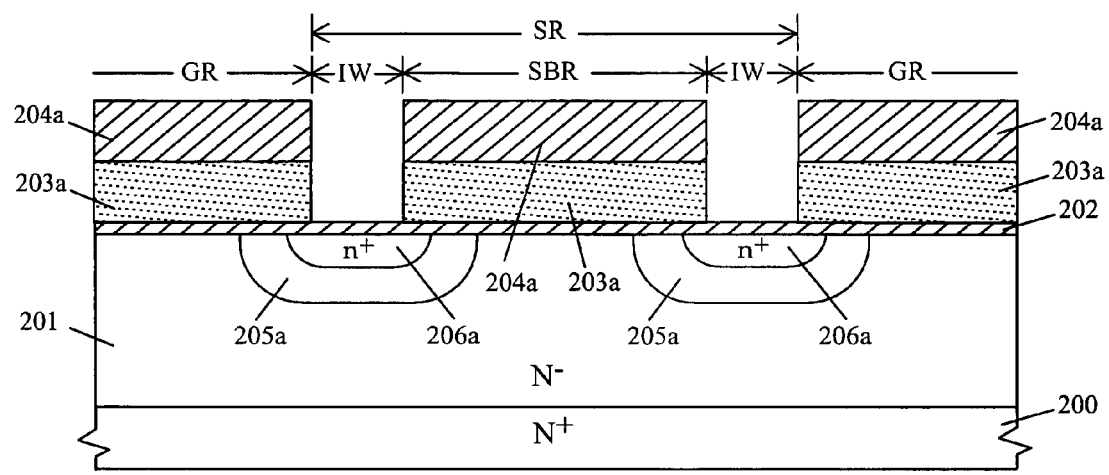

FIG. 3B shows that the capping dielectric layer 204 and the heavily-doped polycrystalline-silicon layer 203 in each of the plurality of implantation windows (IW) are sequentially removed by using anisotropic dry etching and the first masking photoresist (PR1) are then removed; ion implantation is performed through each of the plurality of implantation windows (IW) to form a moderately-doped p-base diffusion ring 205a in the lightly-doped N− epitaxial silicon layer 201; and subsequently, ion implantation is performed through the same window to form a heavily-doped n+ source diffusion ring 206a within the moderately-doped p-base diffusion ring 205a. It should be noted that a space enclosed by each of the plurality of implantation windows (IW) can be square, rectangular, round, hexagonal, or elliptical, etc.

Figure 3C:
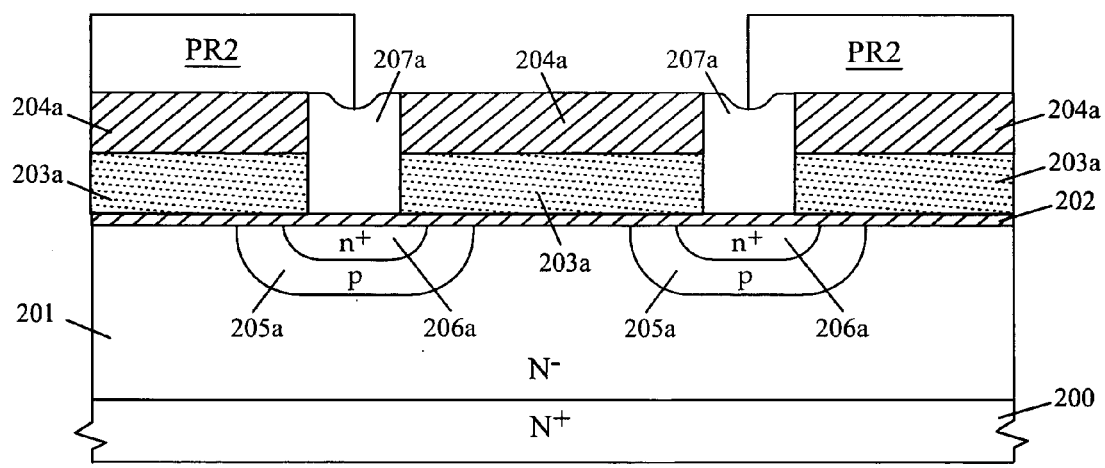

FIG. 3C shows that a gap in each of the plurality of implantation windows (IW) is refilled with a sacrificial dielectric layer 207a and a second masking photoresist (PR2) step is performed to mask the planar gate region (GR) and a portion of the implantation window (IW). The sacrificial dielectric layer 207a is preferably made of silicon nitride as deposited by LPCVD and is formed by first depositing a silicon nitride layer 207 (not shown) with a thickness approximately equal to or larger than one half width of the implantation window (IW) and then etching back a thickness of the deposited dielectric layer 207.

Figure 3D:
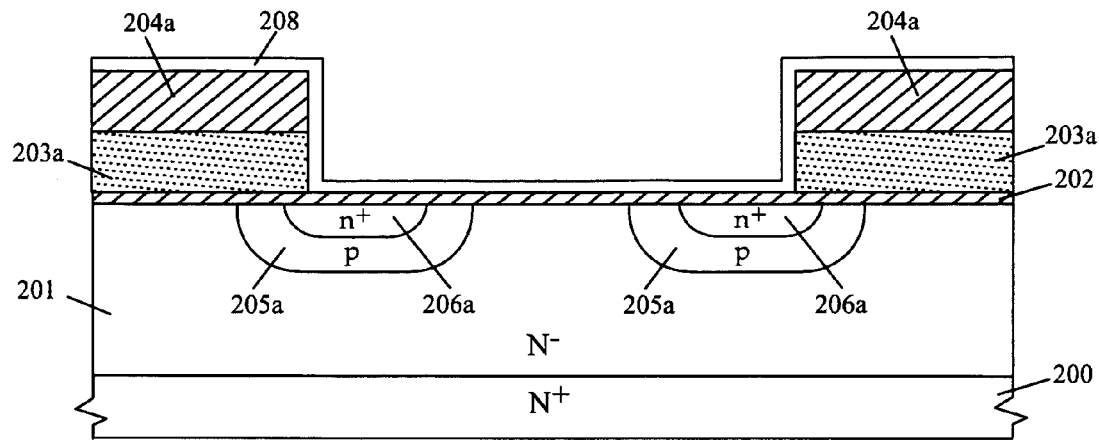

FIG. 3D shows that the patterned capping silicon nitride layer 204a and the patterned heavily-doped polycrystalline-silicon gate layer 203a surrounded by the implantation window (IW) are sequentially removed by anisotropic dry etching and the second masking photoresist (PR2) are then removed; subsequently, the sacrificial dielectric layer 207a in each of the plurality of implantation windows (IW) is removed by hot-phosphoric acid; and thereafter, a protection dielectric layer 208 is formed over a formed structure surface. The protection dielectric layer 208 is preferably made of silicon nitride as deposited by LPCVD and its thickness is preferably between 100 Angstroms and 500 Angstroms.

Figure 3E:
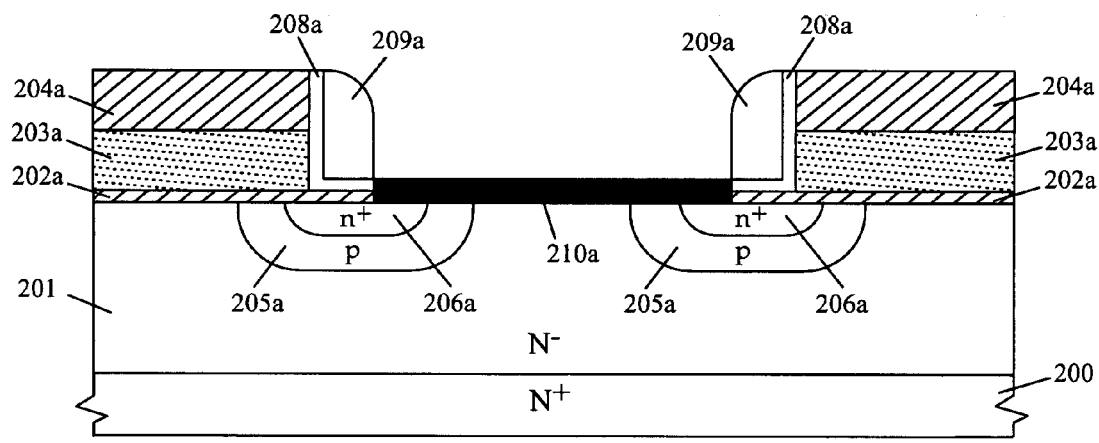

FIG. 3E shows that a sidewall dielectric spacer 209a is formed over a sidewall of the protection dielectric layer 208 and on a side surface portion of the protection dielectric layer 208 and a source contact window is silicided with a self-aligned metal-silicide layer 210a by using a well-known self-aligned silicidation process. The sidewall dielectric spacer 209a is preferably made of silicon dioxide as deposited by LPCVD and is formed by first depositing a silicon dioxide layer 209 (not shown) over the protection dielectric layer 208 and then etching back sequentially a thickness of the deposited silicon dioxide layer 209 and a thickness of the protection dielectric layer 208. The source contact window is formed by removing the gate dielectric layer 202 surrounded by the sidewall dielectric spacer 209a using anisotropic dry etching or by dipping in a dilute hydrofluoric acid. The self-aligned metal silicide layer 210a is a refractory metal silicide layer.

Figure 3F:
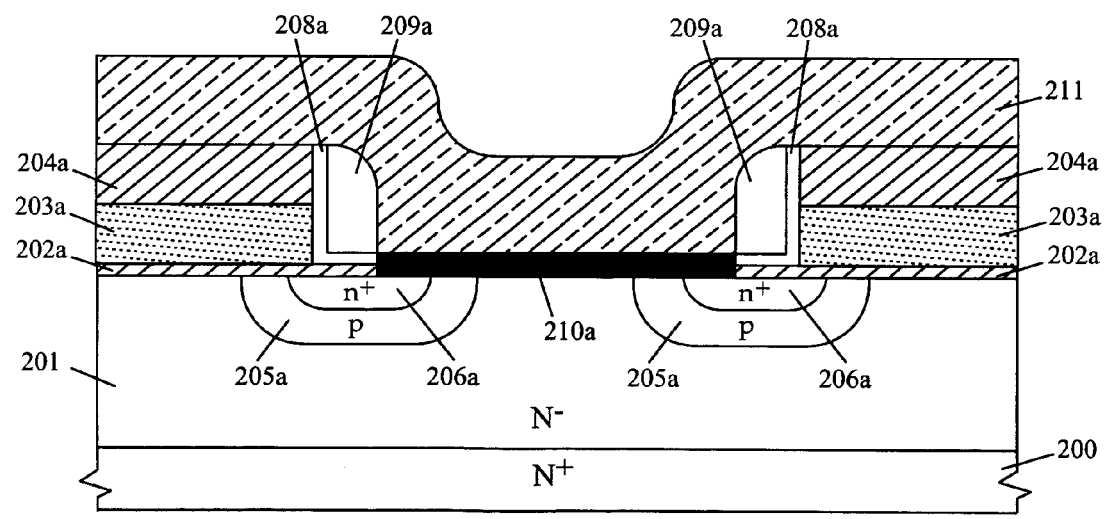

FIG. 3F shows that a source metal layer 211 is formed over the self-aligned metal silicide layer 210a, the sidewall dielectric spacer 209a, a portion of the patterned protection dielectric layer 208a, and the patterned capping dielectric layer 204a. The source metal layer 211 comprises a metal layer over a barrier metal layer. It should be noted that the self-aligned metal silicide layer 210a can be omitted and the metal layer can be directly formed on the source contact window.

From FIG. 3F, it is clearly seen that a Schottky-barrier diode is formed in a middle silicon surface with a moderately-doped p-base diffusion ring 205a as a diffusion guard ring. Moreover, the heavily-doped $n^+$ source diffusion ring 206a is shorted to the moderately-doped p-base diffusion ring 205a. It should be emphasized that the Schottky-barrier diode can be pinched by a depletion region formed by a p-n junction between the moderately-doped p-base diffusion ring 205a and the lightly-doped $N^-$ epitaxial silicon layer 201 in the forward blocking state, so a higher leakage current due to a lower barrier height of the Schottky-barrier diode can be eliminated by the present invention.

FIG. 4A through FIG. 4E show simplified process steps and their schematic cross-sectional views of fabricating a second-type self-aligned Schottky-barrier clamped planar DMOS transistor structure of the present invention.

Figure 4A:
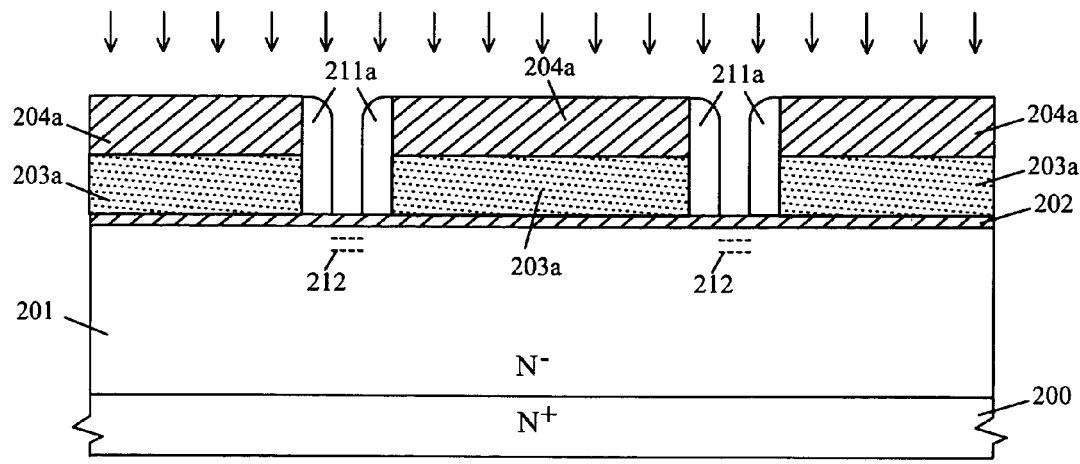
FIG. 4A through FIG. 4E show schematic process steps after FIG. 2B and their cross-sectional views of fabricating a second-type self-aligned Schottky-barrier clamped planar DMOS transistor structure of the present invention.

FIG. 4A shows that after the first masking photoresist (PR1) step to remove the capping dielectric layer 204 on the heavily-doped polycrystalline-silicon layer 203 in each of the plurality of implantation windows (IW) as shown in FIG. 3B, a pair of sacrificial dielectric spacers 211a is formed over sidewalls of the patterned capping dielectric layer 204a on the patterned heavily-doped polycrystalline-silicon gate layer 203a in each of the plurality of implantation windows (IW); and high-energy boron ion implantation is then performed to form a lightly-doped diffusion region 212 in the lightly-doped N-epitaxial silicon layer 201 between the pair of sacrificial dielectric spacers 211a. The pair of sacrificial dielectric spacers 211a are preferably made of silicon nitride as deposited by LPCVD and are formed by first depositing a silicon nitride layer 211 (not shown) over a formed structure surface and then etching back a thickness of the deposited silicon nitride layer 211.

Figure 4B:
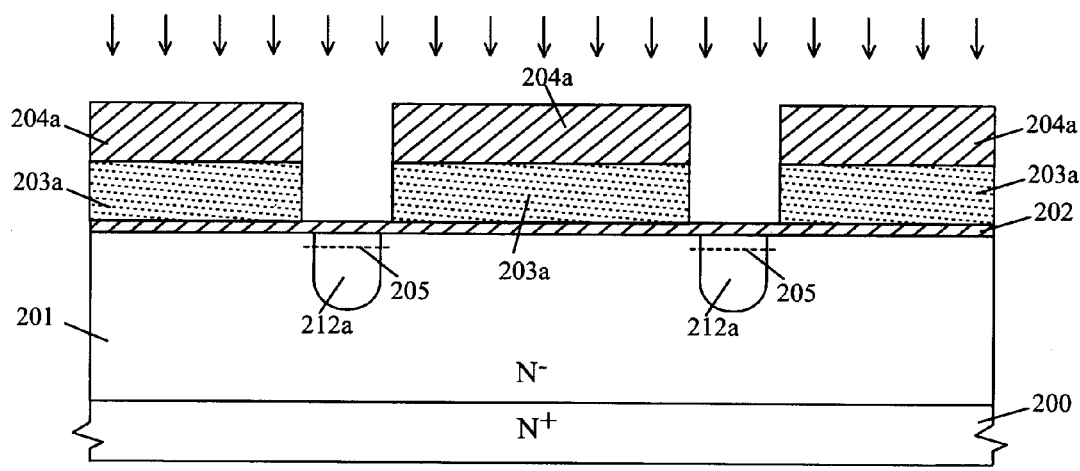

FIG. 4B shows that the pair of sacrificial dielectric spacers 211a is removed by using hot-phosphoric acid; a drive-in process is then performed to form a lightly-doped $p^-$ diffusion region 212a in the lightly-doped $N^-$ epitaxial silicon layer 201 in each of the plurality of implantation windows (IW); and subsequently, ion implantation is performed to form a moderately-doped implant layer 205 through each of the plurality of implantation windows (IW).

Figure 4C:
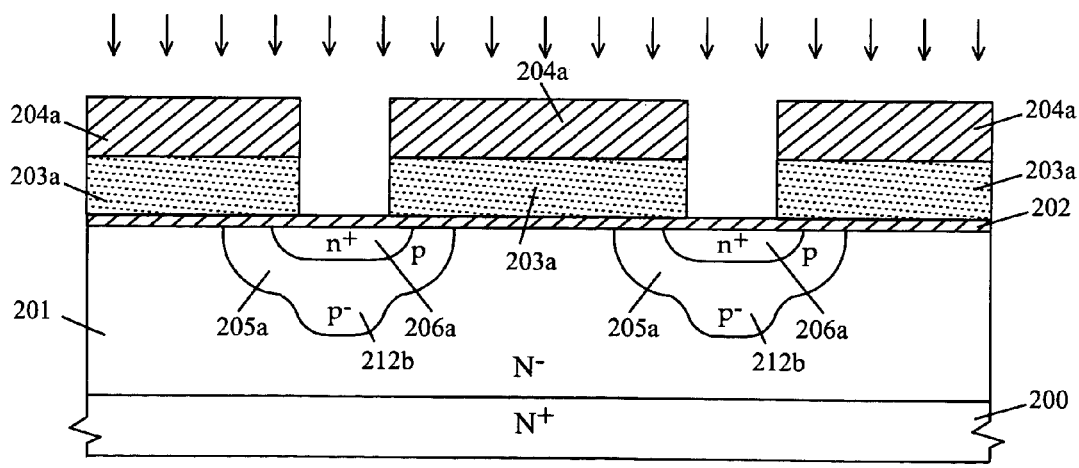

FIG. 4C shows that a drive-in process is performed to form a moderately-doped p-base diffusion ring 205a with a lightly-doped $p^-$ diffusion region 212b being formed in a middle portion beneath the moderately-doped p-base diffusion ring 205a; and subsequently, ion-implantation is performed to form a heavily-doped $n^+$ source diffusion ring 206a within the moderately-doped p-base diffusion ring 205a.

Figure 4D:
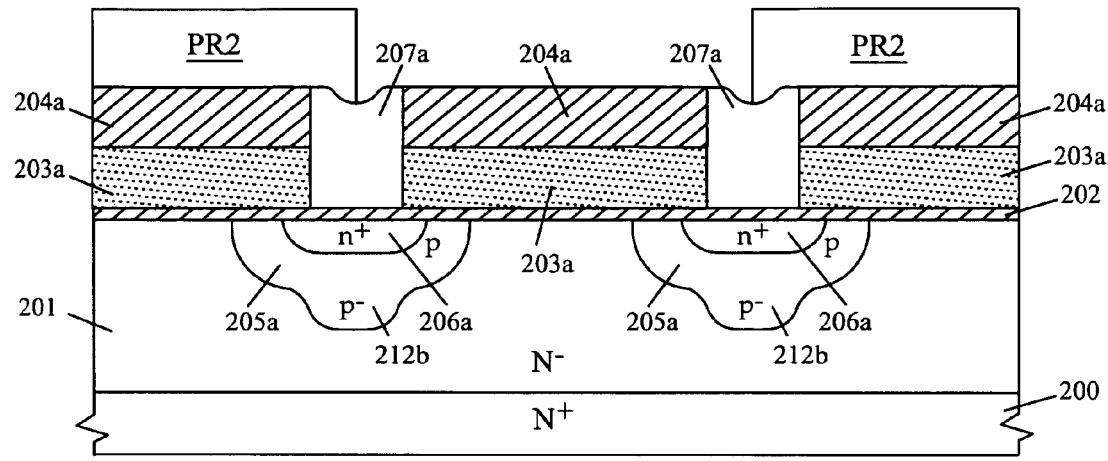
Figure 4E:
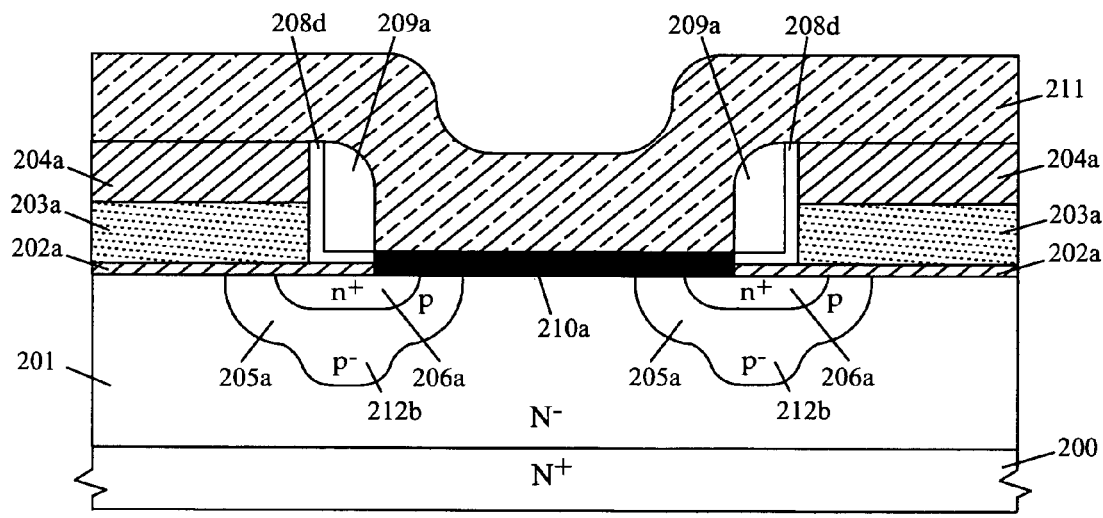

FIG. 4D shows that a sacrificial dielectric layer 207a is formed to fill a gap in each of the plurality of implantation windows (IW); and subsequently, a second masking photoresist (PR2) step is performed, as shown in FIG. 3C.

Following the same process steps as shown in FIG. 3D through FIG. 3F, FIG. 4E can be easily obtained. From FIG. 4E, it is clearly seen that the lightly-doped $p^-$ diffusion region 212b is formed in a middle portion beneath the moderately-doped p-base diffusion ring 205a to further improve breakdown voltage of the planar DMOS transistor structure shown in FIG. 3F.

Referring now to FIG. 5A through FIG. 5D, there are shown simplified process steps after FIG. 3D and their schematic cross-sectional views of fabricating a third-type self-aligned Schottky-barrier clamped planar DMOS transistor structure of the present invention.

Figure 5A:
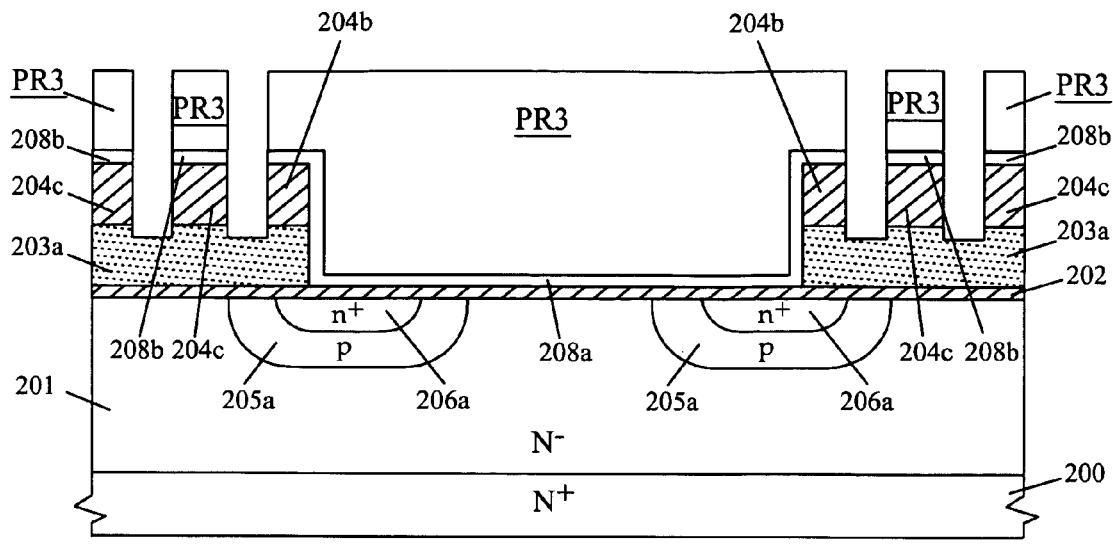
FIG. 5A through FIG. 5D show schematic process steps after FIG. 3D and their cross-sectional views of fabricating a third-type self-aligned Schottky-barrier clamped planar DMOS transistor structure of the present invention.

FIG. 5A shows that a third masking photoresist (PR3) step is performed to pattern the protection dielectric layer 208 and the patterned capping dielectric layer 204a in the planar gate region (GR) as shown in FIG. 3D; and subsequently, the protection dielectric layer 208 and the patterned capping dielectric layer 204a outside of the third masking photoresist (PR3) are sequentially removed by using anisotropic dry etching and the patterned heavily-doped polycrystalline-silicon gate layer 203a can also be slightly etched to form shallow trenches.

Figure 5B:
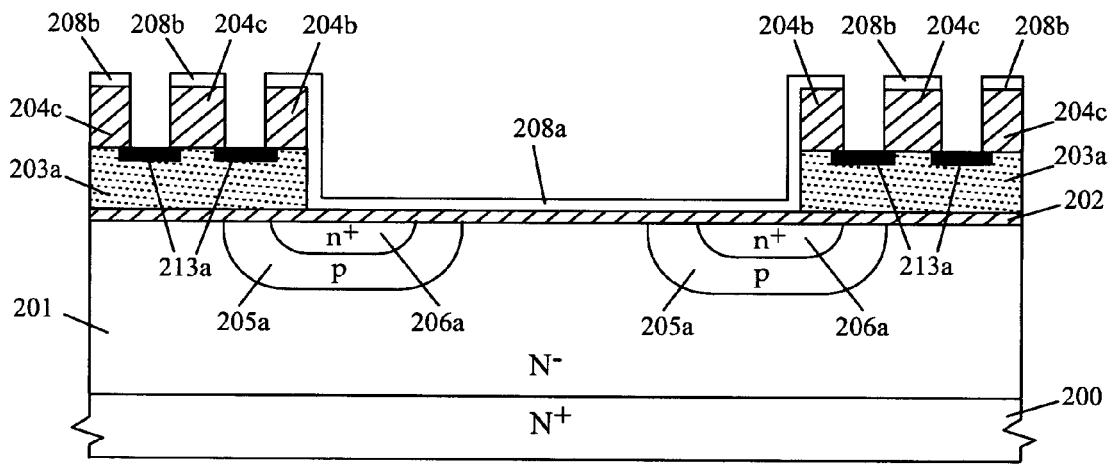

FIG. 5B shows that the third masking photoresist (PR3) are stripped; and a self-aligned silicidation process is performed to form a metal silicide layer 213a over trenched heavily-doped polycrystalline-silicon gate layer 203a through a gap between the patterned capping dielectric layers 204b, 204c. The metal silicide layer 213a is preferably a refractory metal silicide layer such as titanium disilicide ($TiSi_2$), nickel disilicide ($NiSi_2$) or cobalt disilicide ($CoSi_2$).

Figure 5C:
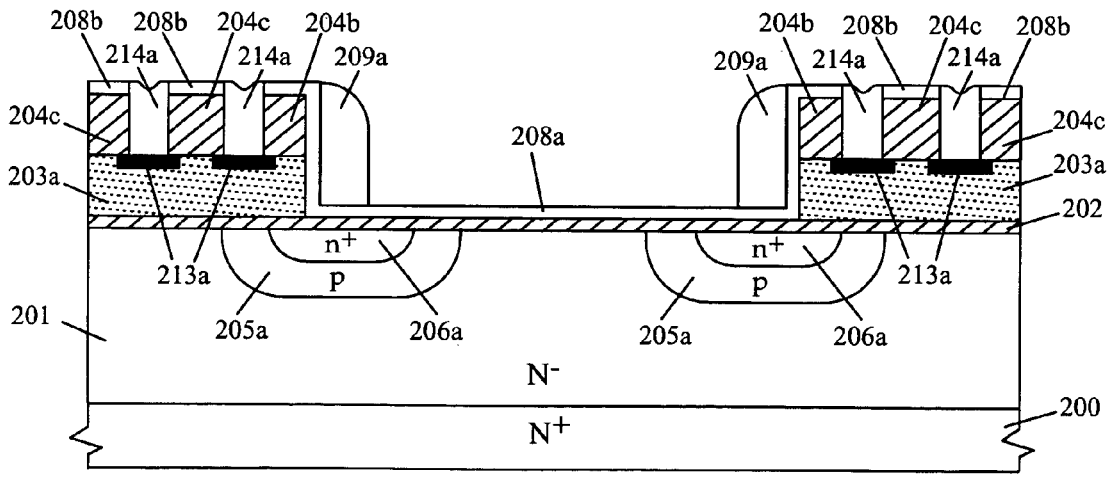

FIG. 5C shows that a sidewall dielectric spacer 209a is formed over a sidewall of the patterned protection dielectric layer 208a and on a side surface portion of the patterned protection dielectric layer 208a in each of the plurality of source regions (SR) and simultaneously, a refilled dielectric layer 214a is formed on the metal silicide layer 213a to fill each gap between the patterned capping dielectric layers 204b, 204c. It should be noted that the sidewall dielectric spacer 209a is formed by the same process steps described in FIG. 3E, but the thickness of the deposited silicon dioxide layer 209 (not shown) is preferably equal to or slightly larger than one half width of the gap between the patterned capping dielectric layers 204b, 204c.

Figure 5D:
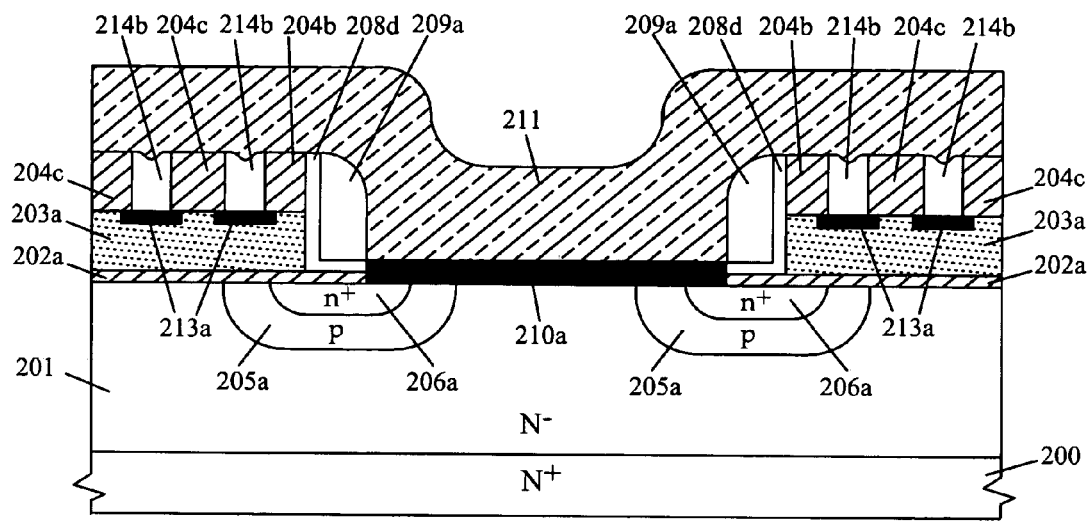

FIG. 5D shows that a source contact window is formed by etching back the patterned protection dielectric layers 208a, 208b using anisotropic dry etching and the gate dielectric layer 202 surrounded by the sidewall dielectric spacer 209a using anisotropic dry etching or dipping in a dilute hydrofluoric acid; following the same process steps shown in FIG. 3E and FIG. 3F, FIG. 5D can be easily obtained.

It is clearly seen from FIG. 5D that the patterned heavily-doped polycrystalline-silicon gate layer 203a is silicided with the metal silicide layers 213a to largely reduce gate-interconnection parasitic resistance and to further improve switching speed of a planar DMOS power transistor.

Figure 6:
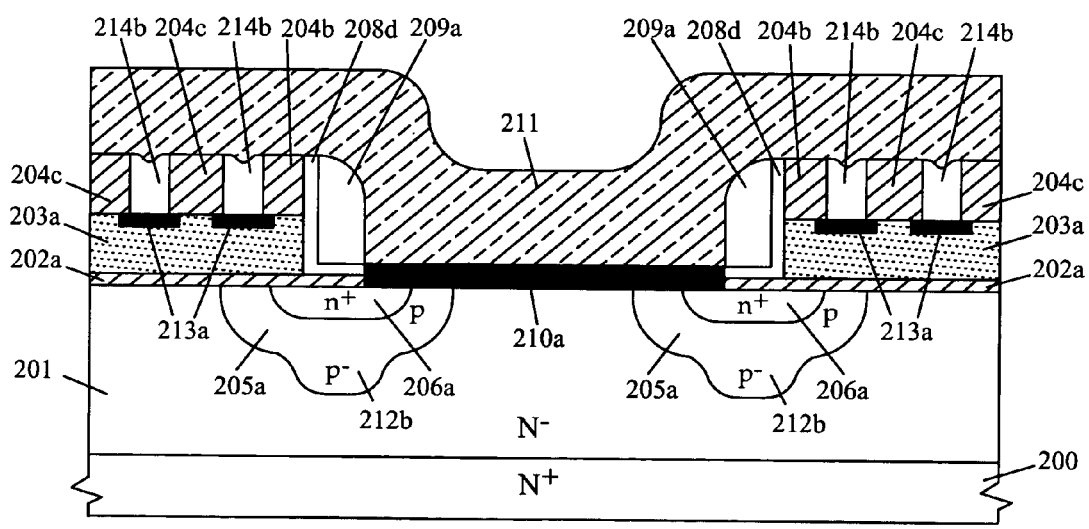
FIG. 6 shows a schematic cross-sectional view of a fourth-type self-aligned Schottky-barrier clamped planar DMOS transistor structure of the present invention.

FIG. 6 shows a fourth-type self-aligned Schottky-barrier clamped planar DMOS transistor structure of the present invention, in which a lightly-doped p⁻ diffusion region 212b is formed in a middle portion beneath the moderately-doped p-base diffusion ring 205a shown in FIG. 4C. The process steps for forming the lightly-doped p⁻ diffusion region 212b are shown in FIG. 4A through FIG. 4C. It is clearly seen that the lightly-doped p⁻ diffusion region 212b shown in FIG. 6 may offer larger breakdown voltage as compared to FIG. 5D.

Based on the above descriptions, the advantages and features of the present invention are summarized below:

(a) The self-aligned Schottky-barrier clamped planar DMOS transistor structure of the present invention offers a Schottky-barrier diode formed in a middle portion of a source region with a moderately-doped p-base diffusion ring as a diffusion guard ring to eliminate edge leakage current and soft breakdown of the Schottky-barrier diode in a forward blocking state.

(b) The self-aligned Schottky-barrier clamped planar DMOS transistor structure of the present invention offers a Schottky-barrier diode being pinched by a p-n junction depletion region between the diffusion guard ring and a lightly-doped N⁻ epitaxial layer in the forward blocking state to further eliminate the leakage current of the Schottky-barrier diode with a low barrier height.

(c) The self-aligned Schottky-barrier clamped planar DMOS transistor structure of the present invention offers a lightly-doped p⁻ diffusion region beneath a middle portion of the moderately-doped p-base diffusion ring to further increase breakdown voltage of planar DMOS transistor cells.

(d) The self-aligned Schottky-barrier clamped planar DMOS transistor structure of the present invention offers a patterned heavily-doped polycrystalline-silicon gate layer being locally silicided with metal silicide layers to reduce gate-interconnection parasitic resistance.

It should be emphasized that the self-aligned Schottky-barrier clamped n-channel planar DMOS transistor structure of the present invention as described can be easily extended to form the self-aligned Schottky-barrier clamped p-channel planar DMOS transistor structures by changing doping types in semiconductor regions. Moreover, the self-aligned Schottky-barrier clamped planar DMOS transistor structures as described can be extended to fabricate insulated-gate bipolar transistors (IGBT) and MOS-controlled thyristors (MCT).

While the present invention has been particularly shown and described with reference to the present examples and embodiments as considered as illustrative and not restrictive. Moreover, the present invention is not to be limited to the details given herein, it will be understood by those skilled in the art that various changes in forms and details may be made without departure from the true spirit and scope of the present invention.

What is claimed is:

1. A self-aligned Schottky-barrier clamped planar DMOS transistor structure, comprising:

a semiconductor substrate of a first conductivity type, wherein the semiconductor substrate comprises a lightly-doped epitaxial semiconductor layer being formed on a heavily-doped semiconductor substrate;

a self-aligned source region being defined to be surrounded by a planar gate region, wherein the self-aligned source region comprises a moderately-doped base diffusion ring of a second conductivity type being formed in the lightly-doped epitaxial semiconductor layer through an implantation window, a heavily-doped source diffusion ring of the first conductivity type being formed in a surface portion of the moderately-doped base diffusion ring through the implantation window, and a self-aligned source contact window being formed on a semiconductor surface of the lightly-doped epitaxial semiconductor layer surrounded by the moderately-doped base diffusion ring, the moderately-doped base diffusion ring surrounded by the heavily-doped source diffusion ring, and the heavily-doped source diffusion ring surrounded by a sidewall dielectric spacer being formed over a sidewall of a protection dielectric layer and on a side surface portion of the protection dielectric layer;

the planar gate region being formed on a gate dielectric layer outside of the self-aligned source region, wherein the planar gate region comprises a patterned heavily-doped polycrystalline-silicon gate layer being formed on the gate dielectric layer and a patterned capping dielectric layer being formed on the patterned heavily-doped polycrystalline-silicon gate layer; and a source metal layer at least formed over the self-aligned source contact window.

2. The self-aligned Schottky-barrier clamped planar DMOS transistor structure according to claim 1, wherein the semiconductor substrate is mode of single crystalline silicon.

3. The self-aligned Schottky-barrier clamped planar DMOS transistor structure according to claim 1, wherein the implantation window is formed by patterning a capping dielectric layer on a heavily-doped polycrystalline-silicon layer through a masking photoresist step.

4. The self-aligned Schottky-barrier clamped planar DMOS transistor structure according to claim 1, wherein the protection dielectric layer is formed over a sidewall of the patterned capping dielectric layer on the patterned heavily-doped polycrystalline-silicon gate layer and on a portion of the gate dielectric layer in the self-aligned source region.

5. The self-aligned Schottky-barrier clamped planar DMOS transistor structure according to claim 1, wherein the source metal layer comprises a metal silicide layer being formed over the self-aligned source contact window and a metal layer over a barrier metal layer being at least formed over the metal silicide layer.

6. The self-aligned Schottky-barrier clamped planar DMOS transistor structure according to claim 1, wherein a lightly-doped diffusion region of the second conductivity type is formed a middle portion beneath the moderately-doped base diffusion ring.

7. The self-aligned Schottky-barrier clamped planar DMOS transistor structure according to claim 1, wherein the patterned heavily-doped polycrystalline-silicon gate layer comprises metal silicide layers being locally formed on its top surface through gaps formed by patterning the patterned capping dielectric layer and capped with refilled dielectric layers.

8. The self-aligned Schottky-barrier clamped planar DMOS transistor structure according to claim 1, wherein the moderately-doped base diffusion ring is acted as a diffusion guard ring for a Schottky-barrier diode being formed by the source metal layer on the lightly-doped epitaxial semiconductor layer surrounded by the moderately-doped base diffusion ring.

9. The self-aligned Schottky-barrier clamped planar DMOS transistor structure according to claim 1, wherein the lightly-doped epitaxial semiconductor layer surrounded by the moderately-doped base diffusion ring and under the source metal layer is pinched by a depletion region of a p-n junction formed between the moderately-doped base diffusion ring and the lightly-doped epitaxial semiconductor layer.

10. A self-aligned Schottky-barrier clamped planar DMOS transistor structure, comprising:

a single crystalline-silicon substrate of a first conductivity type, wherein the single crystalline-silicon substrate comprises a lightly-doped epitaxial silicon layer being formed on a heavily-doped silicon substrate;

a self-aligned source region being defined to be surrounded by a planar gate region, wherein the self-aligned source region comprises a moderately-doped base diffusion ring of a second conductivity type being formed in the lightly-doped epitaxial silicon layer through an implantation window, a heavily-doped source diffusion ring of the first conductivity type being formed in a surface portion of the moderately-doped base diffusion ring through the implantation window, a self-aligned source contact window being formed on a silicon surface of the lightly-doped epitaxial silicon layer surrounded by the moderately-doped base diffusion ring, the moderately-doped base diffusion ring surrounded by the heavily-doped source diffusion ring, and the heavily-doped source diffusion ring surrounded by a sidewall dielectric spacer being formed over a sidewall of the protection dielectric layer and on a side surface portion of the protection dielectric layer;

the planar gate region being formed on a gate dielectric layer outside of the self-aligned source region, wherein the planar gate region comprises a patterned heavily-doped polycrystalline-silicon gate layer being formed on the gate dielectric layer, metal silicide layers being locally formed on the patterned heavily-doped polycrystalline-silicon layer through gaps formed between patterned capping dielectric layers, and refilled dielectric layers being formed to fill the gaps; and a source metal layer being at least formed over the self-aligned source contact window.

11. The self-aligned Schottky-barrier clamped planar DMOS transistor structure according to claim 10, wherein the implantation window is formed by sequentially removing a capping dielectric layer on a heavily-doped polycrystalline-silicon layer through a masking photoresist step and is refilled with a sacrificial dielectric layer after forming the heavily-doped source diffusion ring.

12. The self-aligned Schottky-barrier clamped planar DMOS transistor structure according to claim 10, wherein the lightly-doped diffusion region of the second conductivity type is formed beneath a middle portion of the moderately-doped p-base diffusion ring through a self-aligned implantation window formed between a pair of sacrificial dielectric spacers being formed over sidewalls of the implantation window.

13. The self-aligned Schottky-barrier clamped planar DMOS transistor structure according to claim 10, wherein the protection dielectric layer being made of silicon nitride is formed on a top surface and over a sidewall of the patterned capping dielectric layer on the patterned heavily-doped polycrystalline-silicon gate layer and on the gate dielectric layer in the self-aligned source region.

14. The self-aligned Schottky-barrier clamped planar DMOS transistor structure according to claim 10, wherein a self-aligned metal silicide layer is formed over the self-aligned source contact window before forming the source metal layer and the source metal layer comprises a metal layer over a barrier metal layer.

15. The self-aligned Schottky-barrier clamped planar DMOS transistor structure according to claim 10, wherein the sidewall dielectric spacer and the refilled dielectric layer are made of silicon dioxide as deposited by low pressure chemical vapor deposition (LPCVD).

16. A self-aligned Schottky-barrier clamped planar DMOS transistor structure, comprising:

a single crystalline-silicon substrate of a first conductivity type, wherein the single crystalline-silicon substrate comprises a lightly-doped epitaxial silicon layer being formed on a heavily-doped silicon substrate;

a self-aligned source region being defined to be surrounded by a planar gate region, wherein the self-aligned source region comprises a moderately-doped base diffusion ring of a second conductivity type being formed in the lightly-doped epitaxial silicon layer through an implantation window patterned by a masking photoresist step, a lightly-doped diffusion region of the second conductivity type being formed in a middle portion beneath the moderately-doped base diffusion ring through a self-aligned implantation window formed between a pair of sacrificial dielectric spacers formed over sidewalls of the implantation window, a heavily-doped source diffusion ring of the first conductivity type being formed in a surface portion of the moderately-doped base diffusion ring through the implantation window, and a self-aligned source contact window being formed on a silicon surface of the lightly-doped epitaxial silicon layer surrounded by the moderately-doped base diffusion ring, the moderately-doped base diffusion ring surrounded by the heavily-doped source diffusion ring, and the heavily-doped source diffusion ring surrounded by a sidewall dielectric spacer being formed over a sidewall of a protection dielectric layer and on a side surface portion of the protection dielectric layer;

the planar gate region being formed on a gate dielectric layer outside of the self-aligned source region, wherein the planar gate region comprises a patterned heavily-doped polycrystalline-silicon gate layer being formed on the gate dielectric layer and a patterned capping dielectric layer being formed on the patterned heavily-doped polycrystalline-silicon gate layer; and a source metal layer being at least formed over the self-aligned source contact window.

17. The self-aligned Schottky-barrier clamped planar DMOS transistor structure according to claim 16, wherein a sacrificial dielectric layer being made of silicon nitride is used to refill the implantation window after forming the heavily-doped source diffusion ring and is removed for forming the self-aligned source contact window.

18. The self-aligned Schottky-barrier clamped planar DMOS transistor structure according to claim 16, wherein the protection dielectric layer being made of silicon nitride is formed over a sidewall of the patterned capping dialectic layer on the patterned heavily-doped polycrystalline-silicon gate layer and on the gate dielectric layer in the self-aligned source region.

19. The self-aligned Schottky-barrier clamped planar DMOS transistor structure according to claim 16, wherein the patterned heavily-doped polycrystalline-silicon gate layer is silicided with metal silicide layers through gaps formed between the patterned capping dielectric layers and the gaps are refilled with refilled dielectric layers.

20. The self-aligned Schottky-barrier clamped planar DMOS transistor structure according to claim 16, wherein the source metal layer comprises a refractory metal silicide layer being formed over the self-aligned source contact window by using a self-aligned silicidation process and a metal layer over a barrier metal layer being at least formed over the refractory metal silicide layer.

* * * * *